(12) United States Patent
Takeshima et al.

(10) Patent No.: US 7,223,665 B2
(45) Date of Patent: May 29, 2007

(54) METHOD FOR MANUFACTURING DIELECTRIC THIN FILM CAPACITOR

(75) Inventors: Yutaka Takeshima, Nagaokakyo (JP); Koki Shibuya, Omihachiman (JP)

(73) Assignee: Murata Manufacturing Co., Ltd., Nagao Kakyo-shi (JP)

( * ) Notice: Subject to any disclaimer, the term of this patent is extended or adjusted under 35 U.S.C. 154(b) by 414 days.

(21) Appl. No.: 10/933,309

(22) Filed: Sep. 3, 2004

(65) Prior Publication Data

US 2005/0079670 A1 Apr. 14, 2005

(30) Foreign Application Priority Data

| Sep. 4, 2003 | (JP) | ............................ 2003-312870 |
| Jun. 28, 2004 | (JP) | ............................ 2004-190056 |
| Aug. 25, 2004 | (JP) | ............................ 2004-245776 |

(51) Int. Cl.
*H01L 21/336* (2006.01)
*H01L 31/36* (2006.01)

(52) U.S. Cl. ........................................ 438/308; 257/75

(58) Field of Classification Search ................... 257/75, 257/306, 467, 753; 438/308, 795, 660, 663
See application file for complete search history.

(56) References Cited

U.S. PATENT DOCUMENTS 5,508,226 A * 4/1996 Ito et al. ........................ 427/79

| 6,815,221 B2 * | 11/2004 | Kim et al. ........................ 438/3 |
| 2003/0096472 A1 * | 5/2003 | Kang et al. ................. 438/239 |
| 2004/0028952 A1 * | 2/2004 | Cartier et al. ............... 428/698 |
| 2004/0259383 A1 * | 12/2004 | Choi et al. ................... 438/785 |

FOREIGN PATENT DOCUMENTS

JP   08-078636   3/1996

* cited by examiner

*Primary Examiner*—Calvin Lee
(74) *Attorney, Agent, or Firm*—Dickstein, Shapiro, LLP.

(57) ABSTRACT

A method for manufacturing a dielectric thin film capacitor of the present invention includes the steps of coating a liquid raw material on a substrate and performing a first heat treatment to form an adhesive layer, forming a lower electrode on the adhesive layer, coating a liquid raw material on the lower electrode and performing a second heat treatment to form a dielectric thin film by crystallization, forming an upper electrode on the dielectric thin film, and performing a third heat treatment at a temperature higher than those of the first and second heat treatments. The adhesive layer and the dielectric thin film are formed by using materials having the same composition system or using the same material.

21 Claims, 3 Drawing Sheets

METHOD FOR MANUFACTURING DIELECTRIC THIN FILM CAPACITOR

BACKGROUND OF THE INVENTION

1. Field of the Invention

The present invention relates to a method for manufacturing a dielectric thin film capacitor.

2. Description of the Related Art

A dielectric thin film capacitor used in a semiconductor device such as DRAM or a noise filter has a structure in which a substrate, a lower electrode, a dielectric thin film, and an upper electrode are stacked in order. The dielectric thin film can be deposited by a sputtering process, a CVD process (chemical vapor deposition), a MBE process (molecular beam epitaxy), a sol-gel process, or a MOD process (metalorganic decomposition). However, the sol-gel process and the MOD process are advantageous from the viewpoint of manufacturing cost.

In the sol-gel process or the MOD process for depositing the dielectric thin film, a raw material solution prepared by dissolving an organic compound used as a dielectric raw material in an organic solvent is coated and then heat-treated in an oxidizing atmosphere. Therefore, an non-oxidizable noble metal, for example, Pt, is often used for the lower electrode.

Although a Si substrate is generally used as the substrate of the dielectric thin film capacitor, a Si oxide layer is formed on the surface of the Si substrate because Si becomes oxidized when being allowed to stand in air.

When a dicing-cut process is performed after the dielectric thin film capacitor is formed, an adhesive layer must be formed between the substrate and the lower electrode in order to improve the low adhesion between the Si oxide layer on the surface of the substrate and the noble metal of the lower electrode. The adhesive layer often comprises Ti (refer to Japanese Unexamined Patent Application Publication No. 8-78636).

Japanese Unexamined Patent Application Publication No. 8-78636 discloses that the use of Ti for the adhesive layer has the problem of causing warping of the substrate due to oxidation of the Ti layer and thus causing cracking in the dielectric thin film. This publication also discloses that warping of the substrate can be suppressed by limiting the thickness of the Ti layer functioning as the adhesive layer.

However, another problem occurs even if the thickness of the Ti layer is limited. Namely, even a limited Ti layer is inevitably oxidized in an annealing process or the like. When Ti is oxidized and diffuses at the interface between the lower electrode and the dielectric thin film, two additional problems described below occur.

First, when barium titanate ($BaTiO_3$), strontium titanate ($SrTiO_3$) or strontium barium titanate (($Ba,Sr$)$TiO_3$, abbreviated to "BST" hereinafter) is used for the dielectric thin film, the Ti oxide diffusing at the interface between the dielectric thin film and the lower electrode causes a crystal structure deviation at the interface which causes disturbance in crystallinity of the dielectric thin film. When the crystallinity of the dielectric thin film is disturbed, a sufficient dielectric constant cannot be obtained.

Second, the Ti oxide has a high resistance and a low dielectric constant and thus creates a state in which a layer having a high resistance and a low dielectric constant is present at the interface between the lower electrode and the dielectric thin film to significantly degrade the characteristics of the capacitor.

The above document further discloses that the dielectric thin film is preliminarily burned at a temperature lower than the crystallization temperature to planarize its surface, and then the upper electrode is formed on the dielectric thin film, followed by final burning at a temperature higher than the crystallization temperature. As shown in FIG. 2 of the document, the dielectric constant of the dielectric thin film formed by the production method is about 220, which is relatively low for BST. Under the present situation in which circuit integration is strongly demanded, a capacitor capable of achieving a high capacity with a small area is required, and thus a dielectric thin film having a higher dielectric constant must be formed.

While, the technique disclosed in the above document is capable of suppressing the occurrence of cracking, which causes a leakage current, to some extent, it has the problem of impairing the characteristics of the capacitor and causing difficulty in achieving a high dielectric constant.

SUMMARY OF THE INVENTION

Accordingly, it is an object of the present invention to provide a method for manufacturing a dielectric thin film capacitor comprising an adhesive layer and a dielectric thin film wherein the adhesive layer does not cause cracking, which causes a leakage current, or deterioration in the characteristics of the capacitor, and the dielectric thin film has a smooth surface, which prevents the occurrence of a leakage current, and a sufficient dielectric constant.

In order to solve the problem, a method for manufacturing a dielectric thin film capacitor of the present invention comprises the step of depositing an adhesive layer precursor film and performing a first heat treatment of the film to form an adhesive layer, the step of forming a lower electrode on the adhesive layer, the step of depositing a dielectric thin film precursor film comprising the same material as the adhesive layer precursor film on the lower electrode and performing a second heat treatment at a temperature higher than the crystallization temperature of the dielectric thin film precursor film to form a dielectric thin film, the step of forming an upper electrode on the dielectric thin film, and the step of performing a third heat treatment at a temperature higher than those of the first and second heat treatments.

When the adhesive layer comprises a material having the same composition system as that of the dielectric thin film, the substrate is not warped by expansion of the adhesive layer to prevent the occurrence of cracking in the dielectric thin film. Even if the adhesive layer diffuses at the interface between the lower electrode and the dielectric thin film, the characteristics of the capacitor do not deteriorate.

The term "a material having the same composition system" means a material comprising the same main components, and includes a material comprising the main components at a different ratio, and a material containing traces of other elements.

When the temperature of the second heat treatment is higher than the crystallization temperature of the dielectric thin film precursor film, a dielectric thin film having a sufficient dielectric constant can be obtained. If the temperature of the second heat treatment is lower than the crystallization temperature, a dielectric thin film having a sufficient dielectric constant cannot be obtained even by the third heat treatment at a sufficiently high temperature.

Furthermore, the third heat treatment at a temperature higher than the temperatures of the first and second heat treatments after the formation of the upper electrode can produce a dielectric thin film having a sufficient dielectric constant even when the first and second heat treatments are performed at relatively low temperatures. The temperatures of the first and second heat treatments are preferably as low as possible from the viewpoint of surface planarization.

In the method for manufacturing the dielectric thin film capacitor of the present invention, the adhesive layer precursor film comprises the same material as that of the dielectric thin film precursor film. Therefore, the adhesive layer has substantially the same physical properties as those of the dielectric thin film, thereby decreasing changes in the capacitor characteristics when the adhesive layer diffuses at the interface between the lower electrode and the dielectric thin film. Since the adhesive layer and the dielectric thin film can be formed by using the same material and the same apparatus, the manufacturing cost can be decreased.

In the method for manufacturing the dielectric thin film capacitor of the present invention, the temperature of the first heat treatment is preferably higher than the crystallization temperature of the adhesive layer precursor film.

Japanese Unexamined Patent Application Publication No. 8-78636 discloses that a dielectric thin film having a smooth surface can be formed by heat-treating the dielectric thin film at a temperature lower than the crystallization temperature. However, as a result of intensive research, the inventor found that when the heat treatment temperature is excessively low, the surface is not planarized. The temperature of the first heat treatment is preferably higher than the crystallization temperature of the precursor film and lower than the growth temperature of large crystal grains which decrease surface smoothness.

In the method for manufacturing the dielectric thin film capacitor of the present invention, a ferroelectric material such as barium titanate, strontium titanate, or strontium barium titanate can be used as a material for the dielectric thin film.

Furthermore, in the method for manufacturing the dielectric thin film capacitor of the present invention, each of the lower electrode and the upper electrode comprise platinum. Since platinum is a noble metal and is not oxidized even by a heat treatment step, platinum is suitable for the lower and upper electrodes.

In another aspect of the present invention, a method for manufacturing a dielectric thin film capacitor comprises (a) the step of forming a lower electrode on a substrate, (b) the step of coating a raw material solution on the lower electrode to form a precursor film, (c) the step of performing a first heat treatment at a temperature about 50° C. to 150° C. higher than the crystallization temperature of the precursor film to crystallize the precursor film and form a dielectric thin film, (d) the step of forming an upper electrode on the dielectric thin film, and (e) the step of performing another heat treatment at a temperature at least about 100° C. higher than that of the first heat treatment. Where an adhesive layer is also employed, the first and second heat treatments are at a temperature about 50° C. to 150° C. higher than the crystallization temperatures of the adhesive and dielectric precursor films, respectively, to crystallize the precursor films and an upper electrode on the dielectric thin film, performing another heat treatment at a temperature at least about 100° C. higher than that of the second heat treatment. When the same material is used for the adhesive and dielectric, the heating temperatures may be the same.

Therefore, the dielectric thin film capacitor having a sufficiently smooth surface and a sufficiently high dielectric constant and causing little cracking can be obtained.

When the temperature of the first heat treatment is not more than about 50° C. higher than the crystallization temperature, the dielectric constant of the dielectric thin film is not sufficiently increased even by the second heat treatment. On the other hand, when the temperature of the first heat treatment is excessively high, the crystal grains of the dielectric material grow excessively to make it difficult to planarize the surface of the dielectric thin film, thereby causing cracking and increasing a leakage current. Therefore, the temperature of the first heat treatment is preferably about 50° C. to 150° C. higher than the crystallization temperature of the precursor film.

When the temperature of the second heat treatment is not more than about 100° C. higher than that of the first heat treatment by, crystal growth of the dielectric material does not sufficiently proceed to fail to sufficiently increase the dielectric constant of the dielectric thin film, and a short-circuit failure easily occurs. Therefore, the temperature of the second heat treatment is preferably at least about 100° higher than the temperature of the first heat treatment.

In the present invention, a metal compound having a perovskite structure, such as barium titanate, strontium titanate, or strontium barium titanate, is preferably used for the dielectric thin film.

Since a metal compound having a perovskite structure has a high dielectric constant, a small dielectric thin film capacitor having a high capacity can be obtained.

In the method for manufacturing the dielectric thin film capacitor of the present invention as described above, the adhesive layer and the dielectric thin film are formed by using materials having the same composition system, and thus the substrate is not warped by oxidative expansion of the dielectric thin film, thereby preventing the occurrence of cracking in the dielectric thin film. Also, if the adhesive layer disperses at the interface between the lower electrode and the dielectric thin film, the capacitor characteristics do not deteriorate.

Also, the first and second heat treatments are performed at temperatures higher than the crystallization temperature of the dielectric thin film in the method for manufacturing the dielectric thin film capacitor of the present invention, and then a third heat treatment is performed at a higher temperature after the upper electrode is formed. Therefore, the dielectric thin film having a sufficiently high dielectric constant and no crack cue obtained.

Furthermore, the first heat treatment in the present invention is performed at a temperature about 50° C. to 150° C. higher than the crystallization temperature, and the second heat treatment is performed at a temperature at least about 100° C. higher than the temperature of the first heat treatment. Therefore, a dielectric thin film capacitor having a sufficiently smooth surface and a sufficiently high dielectric constant and no crack can be obtained.

DESCRIPTION OF THE PREFERRED EMBODIMENTS

An embodiment of the present invention will be described below with reference to the drawings. FIGS. 1A to 1E are sectional views showing respective steps for manufacturing a dielectric thin film capacitor according to an embodiment of the present invention.

Figure 1A:
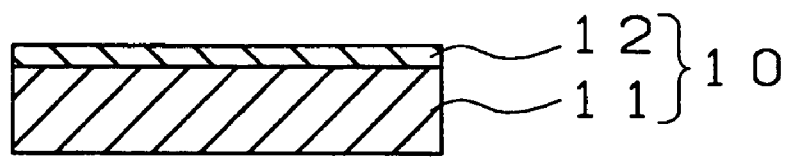
FIGS. 1A to 1E are sectional views showing respective steps for manufacturing a dielectric thin film capacitor according to an embodiment of the present invention.

First, as shown in FIG. 1A, a substrate 10 is prepared. When a Si substrate is used as the substrate 10, a Si oxide layer 12 is generally formed on a surface of the substrate 10, and thus the substrate 10 has a two-layer structure comprising a Si layer 11 and the Si oxide layer 12.

Next, a sol-gel raw material solution or MOD raw material solution containing an organic compound dissolved therein is spin-coated and then dried to deposit an adhesive layer precursor film. Drying may be performed by an appropriate method using a hot plate or by comprising allowing the resultant film to stand at room temperature.

Figure 1B:
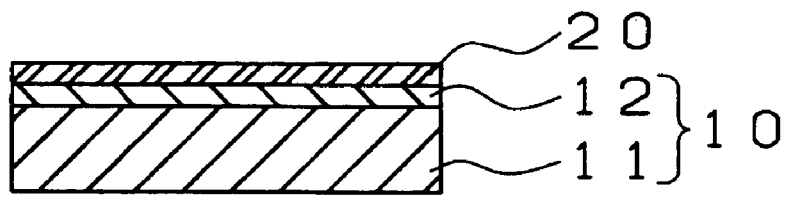

The raw material solution used has the same composition system as that of a raw material solution used for forming a dielectric thin film which will be described below. In this case, materials having the same composition are preferably used. The coating step and drying step may be repeated several times until a desired thickness is obtained. When the adhesive layer precursor film having a desired thickness is obtained, the adhesive layer precursor film is crystallized by a first heat treatment to form an adhesive layer 20, as shown in FIG. 1B.

The temperature of the first heat treatment is preferably higher than the crystallization temperature of the precursor film. When the temperature of the first heat treatment is lower than the crystallization temperature, the adhesive layer 20 becomes aggregated to decrease the surface smoothness. On the other hand, when the temperature of the heat treatment is excessively high, large crystal grains are grown to impair the surface smoothness. Therefore, the first heat treatment is preferably performed at a temperature which allows growth of relatively small crystal grains. The first heat treatment can be performed by a RTA (rapid thermal annealing) apparatus or an electric furnace.

Figure 1C:
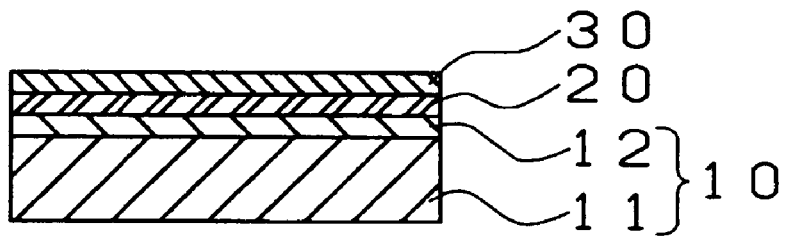

Next, as shown in FIG. 1C, a lower electrode 30 is formed on the adhesive layer 20. The lower electrode 30 is preferably formed by using a material which is oxidized to a small degree, at best, in the steps of second and third heat treatments described below. In order to form the lower electrode 30, a noble metal such as Au, Pd, or Rh can be used, and Pt is preferably used. The lower electrode 30 can be formed by a sputtering process.

Figure 1D:
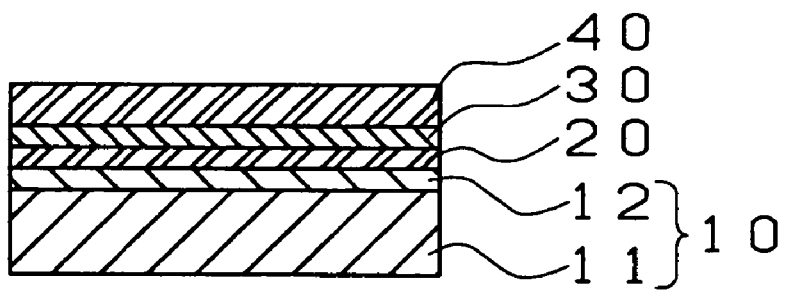

Then, a sol-gel raw material solution or MOD raw material solution containing an organic compound dissolved therein is spin-coated on the lower electrode 30 and then dried to deposit a dielectric thin film precursor film. The coating step and drying step may be repeated several times until a desired thickness is obtained. When the dielectric thin film precursor film having a desired thickness is obtained, the dielectric thin film precursor film is crystallized by the second heat treatment to form a dielectric thin film 40, as shown in FIG. 1D. As a material for the dielectric thin film 40, a material such as barium titanate, strontium titanate or strontium barium titanate (BST) can be used.

As described above, the adhesive layer 20 and the dielectric thin film 40 are formed by using materials having the same composition system or using the same material. The term "materials having the same composition system" means, for example, BST materials having different ratios of Ba:Sr:Ti and materials containing traces of different components other than these main components.

The temperature of the second heat treatment is preferably higher than the crystallization temperature of the precursor film. When the temperature of the second heat treatment is lower than the crystallization temperature, the dielectric thin film 40 becomes aggregated to decrease the surface smoothness. Also, when the temperature of the second heat treatment is lower than the crystallization temperature, the dielectric thin film 40 having a sufficiently high dielectric constant cannot be obtained even by a heat treatment at a temperature higher than the crystallization temperature after an upper electrode is formed, as described below.

On the other hand, large crystal grains grow impair the surface smoothness when the temperature of the second heat treatment is excessively high. Therefore, the second heat treatment is preferably performed at a temperature which allows growth of relatively small crystal grains.

Next, upper electrodes 51 and 52 are formed on the dielectric thin film 40. After the upper electrodes 51 and 52 are formed, the third heat treatment is performed at a temperature sufficiently higher than the crystallization temperature of the dielectric thin film 40 to form a dielectric thin film capacitor shown in FIG. 1E.

The upper electrodes 51 and 52 are formed by using a noble metal such as Au, Pd, or Rh so that they are oxidized to as small an extent feasible by the third heat treatment. Particularly, Pt is preferably used.

Figure 1E:
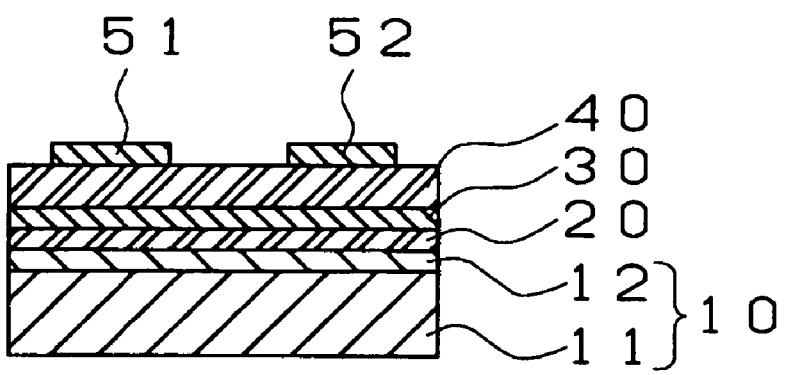

Although FIG. 1E shows the upper electrodes 51 and 52 partially formed on the dielectric thin film 40, an upper electrode may be formed over the entire surface of the dielectric thin film 40.

In the present invention, the second heat treatment is performed at a temperature higher than the crystallization temperature, and the third heat treatment is performed at a temperature higher than that of the second heat treatment after the upper electrodes 51 and 52 are formed, and thus the dielectric constant of the dielectric thin film 40 can be sufficiently increased.

In the present invention, the adhesive layer 20 and the dielectric thin film 40 are formed by using the same material system, and thus the substrate 10 is not warped by oxidative expansion of the adhesive layer 20, thereby preventing the occurrence of cracking in the dielectric thin film 40. Also, even if the adhesive layer 20 diffuses at the interface between the lower electrode 30 and the dielectric thin film 40, the capacitor characteristics are not adversely affected because the adhesive layer 20 and the dielectric thin film 40 comprise the same material system.

EXAMPLES

The present invention will be described in further detail below with reference to examples. FIG. 1A shows the substrate 10 comprising a (100) plane Si substrate having a diameter of 3 inches and a thickness of 0.38 mm. Also, the Si oxide layer 12 having a thickness of 1 μm is formed on the surface of the substrate 10 by heat treatment, and thus the substrate 10 has a two-layer structure comprising the Si layer 11 and the Si oxide layer 12.

First, a sol-gel raw material solution containing an organic compound used as a BST (barium strontium titanate) raw material was spin-coated on the substrate 10 and then dried on a hot plate heated to 300° C. for 5 minutes. The coating and drying were repeated two times each to form an adhesive layer precursor film. Then, a RTA heat treatment was performed as a first heat treatment in an oxygen atmosphere at 650° C. for 10 minutes. In this heat treatment, the adhesive layer precursor film was crystallized to form the adhesive layer 20 comprising BST, as shown in FIG. 1B. The raw material solution used had a composition ratio of Ba:Sr:Ti=70:30:100.

Next, as shown in FIG. 1C, the lower electrode 30 comprising Pt and having a thickness of about 200 nm was formed on the adhesive layer 20 by sputtering.

Next, a sol-gel raw material solution of BST was coated and dried two times each by the same method as described above, and a RTA heat treatment (second heat treatment) was performed in an oxygen atmosphere at 650° C. for 10 minutes. In this step, the dielectric thin film 40 was formed as shown in FIG. 1D. As a result of XRD (X-ray diffraction analysis) of the dielectric thin film 40 after the second heat treatment, crystallization of the dielectric thin film 40 was confirmed. However, during cooling, micro cracks little occur due to thermal stress because of the small crystal grains.

Next, as shown in FIG. 1E, the upper electrodes 51 and 52 comprising Pt and having a diameter of 1 mm and a thickness of about 200 nm were formed at a distance of 2 mm therebetween by using a stainless metal mask. In this state, a probe was applied to the two adjacent upper electrodes 51 and 52 to measure capacitance. The measurement showed a capacitance of 7.0 nF, and a dielectric constant of about 320. Furthermore, a RTA heat treatment was performed as a third heat treatment in a oxygen atmosphere at 750° C. for 60 minutes. In this state, the capacitance and leakage current with an applied voltage of 2.0 V were measured by the same method as described above. As a result, the capacitance was 9.5 nF, the dielectric constant was about 440 and the leakage current was 98 pA. Also, the short-circuit ratio was 2%. In the third heat treatment, the dielectric constant could be increased to obtain the dielectric thin film 40 having a high dielectric constant. Furthermore, little cracking occurred to decrease the leakage current and the short-circuit ratio.

After the capacitance and the leakage current were measured, a cutting test was conducted by a dicing saw. However, delamination did not occur between the respective layers to indicate that each layer had sufficiently high adhesive strength.

Comparative Example 1

A dielectric thin film capacitor was produced by the same method as in the above example except that the second heat treatment was performed at 500° C. for 10 minutes. As a result of XRD (X-ray diffraction analysis) of the dielectric thin film after the second heat treatment, crystallization was not observed. After the second heat treatment, the capacitance was 1.1 nF and the dielectric constant was about 50. Since the dielectric thin film 40 was not yet crystallized, the dielectric constant was low. After the third heat treatment, the capacitance was 5.2 nF and the dielectric constant was about 240. Since the temperature of the second heat treatment was lower than the crystallization temperature, the dielectric constant was not sufficiently increased even by the third heat treatment at a temperature higher than the crystallization temperature. This is possibly due to the fact that crystallization of the dielectric thin film 40 is restricted by Pt of the upper electrodes 51 and 52.

Also, the leakage current was 160 pA and the short-circuit ratio was 33%. Particularly, the short-circuit ratio was higher than that in the example. This is possibly due to the fact that in the third heat treatment for crystallizing the dielectric thin film 40, crystallization of BST in a portion having the upper electrodes 51 and 52 is restricted by Pt, while crystallization in a portion without the upper electrodes 51 and 52 is not restricted. Therefore, crystallization and grain growth relatively readily proceed in the portion without the upper electrodes 51 and 52 to concentrate stress in a portion of the dielectric thin film 40 around the upper electrodes 51 and 52.

Comparative Example 2

A dielectric thin film capacitor was produced by the same method as in the above example except that the second heat treatment was performed at 750° C. for 60 minutes, and the third heat treatment was not performed. As a result of XRD (X-ray diffraction analysis) of the dielectric thin film 40 after the second heat treatment, crystallization was observed. After the second heat treatment, the capacitance was 8.1 nF, and the dielectric constant was about 370, the leakage current was 230 pA and the short-circuit ratio was 12%.

Since the second heat treatment was performed at a temperature sufficiently higher than the crystallization temperature, the dielectric constant was relatively high. However, the temperature of the second heat treatment was higher than that in Example, and thus the dielectric thin film 40 was subjected to strong tensile stress over the entire surface thereof due to a difference between the linear expansion coefficients of the substrate 10 and the dielectric thin film 40 during cooling after the second heat treatment. Therefore, many micro cracks occurred in the dielectric thin film 40 to increase the leakage current.

The results of the Example and Comparative Examples 1 and 2 indicate that when the temperatures of the first and second heat treatments are higher than the crystallization temperature and do not allow the growth of large crystal grains, and the temperature of the third heat treatment after the formation of the upper electrodes 51 and 52 is higher than the temperatures of the first and second heat treatments, the dielectric thin film 40 having a sufficient dielectric constant and no cracks can be obtained. The preferred temperature ranges of the heat treatments in the example and the comparative examples depend upon the raw material solutions of the adhesive layer 20 and the dielectric thin film 40.

FIGS. 2A to 2E are sectional views showing respective steps for manufacturing a dielectric thin film capacitor according to another embodiment of the present invention. FIG. 3 is a flowchart showing the principal steps of the manufacturing steps.

Figure 2A:
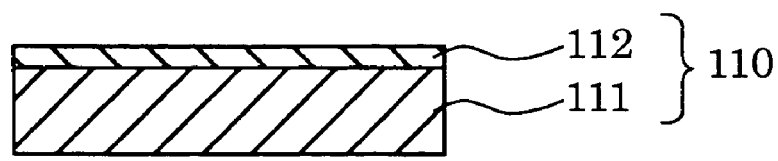
FIGS. 2A to 2E are sectional views showing respective steps for manufacturing a dielectric thin film capacitor according to another embodiment of the present invention.
Figure 3:
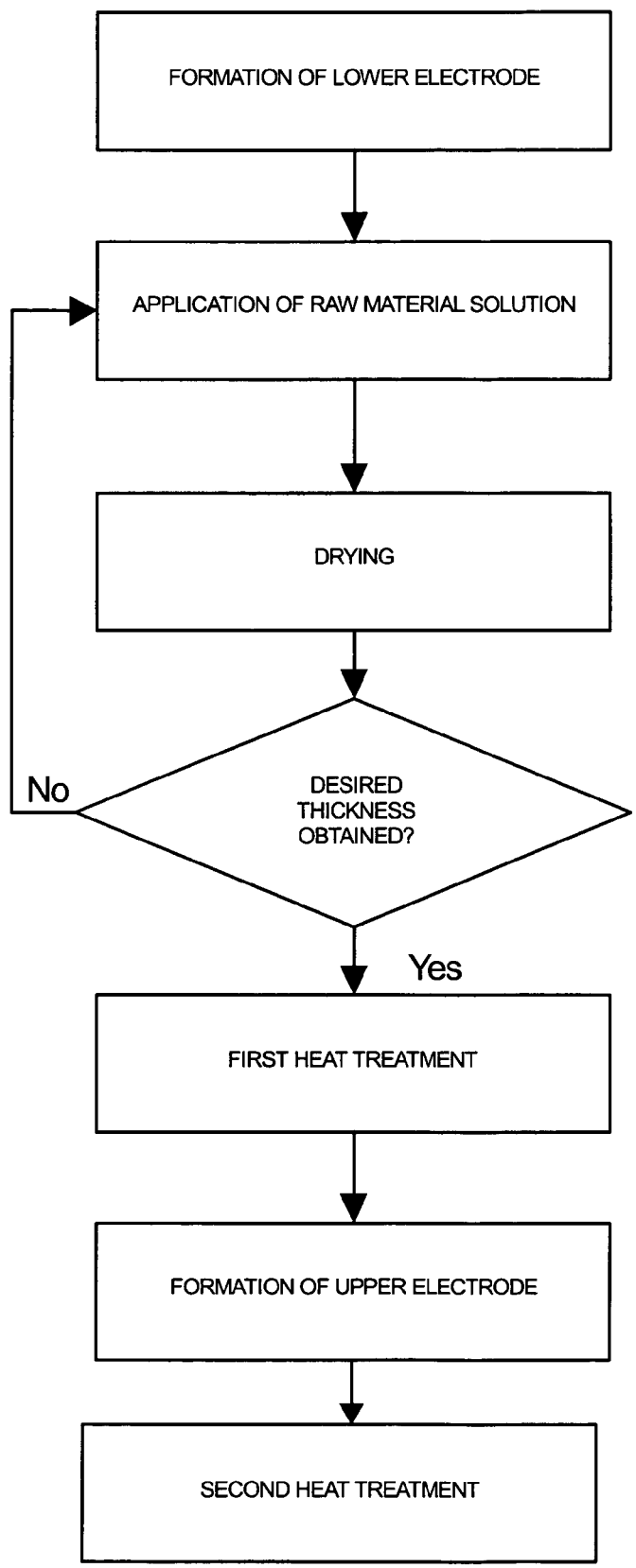
FIG. 3 is a flowchart illustrating the principal steps of the manufacturing steps shown in FIGS. 2A to 2E.

As shown in FIG. 2A, a substrate 110 comprising single crystal Si is prepared. Since a $SiO_2$ film 112 is formed on a surface of the substrate 110, the substrate 110 has a two-layer structure comprising a Si layer 111 and the $SiO_2$ layer 112.

Figure 2B:
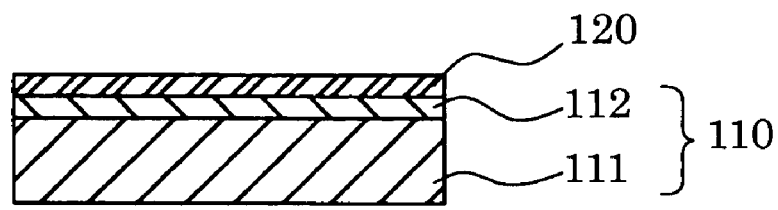

Next, as shown in FIG. 2B, a raw material solution containing an organic compound composed of Ba, Sr and Ti is spin-coated, dried and then heat-treated in an oxidizing atmosphere to form an adhesive layer 120 comprising barium strontium titanate ($BaSrTiO_3$, abbreviated to "BST" hereinafter).

The adhesive layer 120 may comprise Ti or Ta instead of BST, and the adhesive layer 120 is not necessarily formed.

Figure 2C:
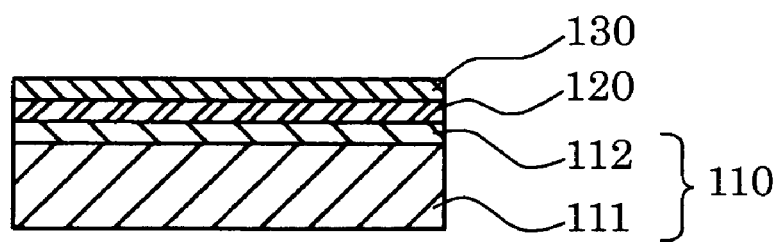

Next, as shown in FIG. 2C, a lower electrode 130 is formed on the adhesive layer 120 by any desired deposition process such as a sputtering process or a vapor deposition process. For the lower electrode 130, a noble metal or a conductive oxide which is not oxidizable in an oxidizing atmosphere is preferred, and, for example, Pt, $RuO_2$, or $IrO_2$ can be used.

Figure 2D:
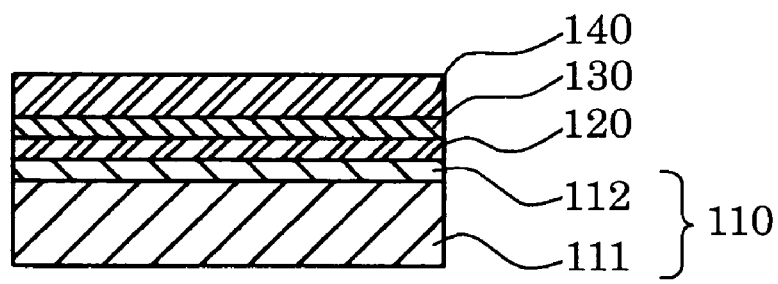

Next, a BST raw material solution containing an organic compound composed of Ba, Sr and Ti at a ratio of Ba:Sr:Ti=7:3:10 is spin-coated on the lower electrode 130 and then dried on a hot plate to form a precursor film. The coating and drying of the raw material solution may be repeated until a desired thickness is obtained. Then, the precursor film is crystallized by a heat treatment (first heat treatment) at a temperature about 50° C. to 150° C. higher than the crystallization temperature of the dielectric material (BST) in an oxidizing atmosphere to form a dielectric thin film 140 as shown in FIG. 2D.

For the dielectric thin film 140, a metal compound having a perovskite structure with a high dielectric constant is preferred, and strontium barium titanate, barium titanate, or strontium titanate can be used.

Figure 2E:
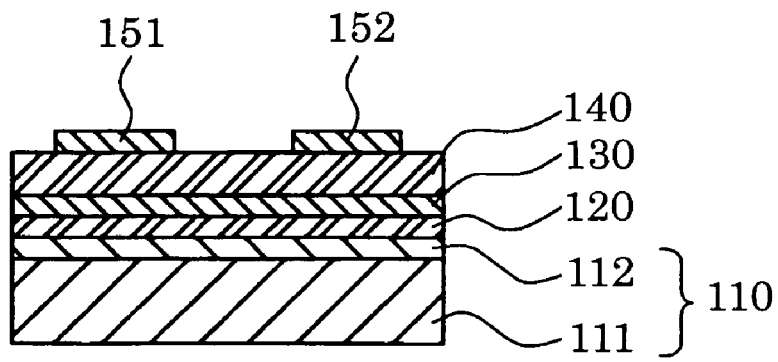

Next, as shown in FIG. 2E, upper electrodes 151 and 152 are formed on the dielectric thin film 140 by any desired deposition process such as a sputtering process or a vapor deposition process. For the upper electrodes 151 and 152, a noble metal or a conductive oxide which is not oxidizable in an oxidizing atmosphere is preferred, and for example, Pt, $RuO_2$, or $IrO_2$ can be used.

Although, in the drawing, the upper electrodes 151 and 152 are partially formed on the dielectric thin film 140, an upper electrode may be formed over the entire surface of the dielectric thin film 140.

Next, a heat treatment (second heat treatment) is performed at a temperature at least about 100° C. higher than that of the first heat treatment in an oxidizing atmosphere to increase the dielectric constant of the dielectric thin film 140. In this step, crystallization of the dielectric thin film 140 does not sufficiently proceed to decrease insulation and fails to increase the dielectric constant unless the temperature is at least about 100° C. higher than that of the first heat treatment.

Therefore, a dielectric thin film capacitor having a sufficiently high dielectric constant and a smooth surface and little causing cracks is completed.

Example

Examples of the present invention will be described in further detail below with reference to FIG. 2.

First, as shown in FIG. 2A, the substrate 110 comprising single crystal Si and having a diameter of 4 inches was prepared. The substrate 110 had a two-layer structure comprising the Si layer 111 and the $SiO_2$ layer 112.

Next, a raw material solution containing an organic compound used as a raw material of BST was spin-coated on the substrate 110 and then dried on a hot plate. The spin-coating and drying were repeated several times each, and then a heat treatment was performed by a RTA (rapid thermal annealing) apparatus in an oxidizing atmosphere at 650° C. for 10 minutes to form the adhesive layer 120 comprising BST as shown in FIG. 2B.

Next, the lower electrode 130 comprising Pt was formed on the adhesive layer 120 by a RF sputtering process as shown in FIG. 2C. If the lower electrode 130 has a large thickness, the equivalent series resistance of the dielectric thin film capacitor decreases and the manufacturing cost increases. Therefore, the thickness is preferably determined according to the desired equivalent series resistance and manufacturing cost.

Next, a BST raw material solution containing an organic compound composed of Ba, Sr, and Ti at a composition ratio of Ba:Sr:Ti=7:3:10 was spin-coated on the lower electrode 130 and then dried on a hot plate to form a precursor film. In order to achieve the desired thickness, coating and drying of the raw material solution were repeated two times each. Then, a heat treatment (first heat treatment) was performed by a RTA apparatus in an oxidizing atmosphere at a temperature about 50° C. to 150° C. higher than the crystallization temperature of the dielectric material. In this heat treatment, the precursor film was crystallized to form the dielectric thin film 140 as shown in FIG. 2D. The thickness of the dielectric thin film 140 measured by an ellipsometer was 125 nm to 130 m.

In this example, it was previously confirmed that the crystallization temperature of the dielectric material was between 500° C. and 550° C., and thus the heat treatment may be performed at 600° C. or more in order that the temperature of the heat treatment is at least about 50° C. higher than the crystallization temperature. In order to avoid a heat treatment temperature at least about 150° C. higher than the crystallization temperature, the heat treatment is preferably performed at 650° C. or less.

The crystallization temperature of the dielectric material depends upon the type and composition of the dielectric material, and even with the same composition, and the crystallization temperature also depends upon the composition of the raw material solution. Therefore, preferably, the crystallization temperature is previously confirmed by experiment. After the heat treatment, X-ray diffraction analysis was performed for confirming crystallization by observing a peak derived from a perovskite phase of BST.

Next, as shown in FIG. 2E, the upper electrodes 151 and 152 comprising Pt and having a diameter of 1 mm were formed by a RF sputtering process using a stainless metal mask.

Then, a heat treatment (second heat treatment) was performed by a RTA apparatus in a oxidizing atmosphere for a predetermined time at a temperature at least about 100° C. higher than the temperature of the first heat treatment. In this step, the dielectric constant of the dielectric thin film 140 was increased to complete a dielectric thin film capacitor of the present invention.

Experiment 1

The first heat treatment of the above-described steps was performed for 30 minutes at a predetermined temperature of 550° C. to 700° C. to prepare a dielectric thin film capacitor, and the dielectric constant and tan δ of the dielectric thin film 140 were measured. The results are shown in Table 1. In Table 1, Sample Nos. #1 and #4 are comparative examples out of the range of the present invention, and a value of tan δ is a value measured at a frequency of 1 kHz.

TABLE 1

| Sample No. | Temperature of first heat treatment (° C.) | Temperature of second heat treatment (° C.) | Dielectric constant | tan δ (%) |
|---|---|---|---|---|
| #1 | 550 | 800 | 650 | 7.5 |
| #2 | 600 | 800 | 390 | 2.1 |
| #3 | 650 | 800 | 385 | 2.1 |
| #4 | 700 | 800 | Not Measurable | Not Measurable |

Table 1 indicates that in Sample No. #1 in which the temperature of the first heat treatment is 550° C., the dielectric constant is high, but the value of tan δ is undesirably high because the temperature of the first heat treatment is not more than about 50° C. higher than the crystallization temperature.

In Sample No. #4, the temperature of the first heat treatment is excessively high, and thus the dielectric thin film 140 is cracked to cause a short-circuit, thereby preventing to measurement of the dielectric constant and tan δ.

On the other hand, Samples Nos. #2 and #3 show dielectric constants of 390 and 385, respectively, and thus the dielectric constants are higher than that of the dielectric thin film capacitor described in Japanese Unexamined Patent Application Publication No. 8-78636. Also, the value of tan δ is as low as 2.1, and thus a low loss is achieved.

Experiment 2

The second heat treatment of the above-described steps was performed for 30 minutes at a predetermined temperature of 700° C. to 850° C. to prepare a dielectric thin film capacitor, and the dielectric constant, tan δ, and the percent defective of the dielectric thin film 140 were measured. The results are shown in Table 2. In Table 2, Sample No. #5 is a comparative example out of the range of the present invention, and the value of tan δ is a value measured at a frequency of 1 kHz. The percent defective represents the percent of defectives due to an initial short circuit.

TABLE 2

| Sample No. | Temperature of first heat treatment (° C.) | Temperature of second heat treatment (° C.) | Dielectric constant | tan δ (%) | Percent defective (%) |
|---|---|---|---|---|---|
| #5 | 650 | 700 | 250 | 1.7 | 46 |
| #6 | 650 | 750 | 325 | 1.7 | 4 |
| #7 | 650 | 800 | 385 | 2.1 | 0 |
| #8 | 650 | 850 | 420 | 4.2 | 2 |

Table 2 indicates that in Sample No. #5 in which the temperature of the second heat treatment is not more than about 100° C. higher than the temperature of the first heat treatment, the dielectric constant of the dielectric thin film 140 remains as low as 250 and the percent defective is 46% to show a significantly low yield. This is possibly due to the fact that crystallization of the dielectric thin film 140 does not sufficiently proceed because the temperature of the second heat treatment is not sufficiently elevated.

On the other hand, Samples Nos. #6 to #8 within the range of the present invention show a dielectric constant of 325 to 420, which is higher than that of the dielectric thin film capacitor described in Japanese Unexamined Patent Application Publication No. 8-78636. Also, the value of tan δ is as low as 1.7 to 2.2, and thus a low loss is achieved. Furthermore, the percent defective is suppressed to 4% or less, and thus a high yield is exhibited.

The measurement of a leakage current for examining the insulation of Sample No. #8 showed a leakage current density of as low as $3.1 \times 10^{-10}$ A/cm$^2$ with an electric field intensity of 10 kV/cm. It was thus confirmed that Sample No. #8 has a satisfactory insulating property.

As described above, the method for manufacturing the dielectric thin film capacitor of the present invention is capable of forming a dielectric thin film capacitor causing little cracking and having a smooth surface and a sufficiently high dielectric constant.

The present invention is not limited to the above examples, and various changes can be made within a range in which the advantage of the present invention can be achieved. For example, the shape and thickness of each of the lower electrode, the upper electrode, and the dielectric thin film may be changed to any values, or another configuration may be added.

What is claimed is:

1. A method for manufacturing a dielectric thin film capacitor comprising:
    forming an adhesive layer precursor film and performing a first heat treatment to crystallize the adhesive layer precursor film and form an adhesive layer;
    forming a lower electrode on the adhesive layer;
    depositing a dielectric thin film precursor film comprising the same main components as that of the adhesive layer precursor film on the lower electrode and performing a second heat treatment at a temperature higher than the crystallization temperature of the dielectric thin film precursor film to form a dielectric thin film;
    forming an upper electrode on the dielectric thin film; and
    performing a third heat treatment at a temperature higher than those of the first and second heat treatments.

2. The method according to claim 1, wherein the adhesive layer precursor film and the dielectric thin film precursor film comprise the same elements in the same ratio.

3. The method according to claim 1, wherein the temperature of the first heat treatment is higher than the crystallization temperature of the adhesive layer precursor film.

4. The method according to claim 1, wherein the dielectric thin film comprises barium titanate, strontium titanate or strontium barium titanate.

5. The method according to claim 1, wherein the lower electrode comprises platinum.

6. The method according to claim 1, wherein the upper electrode comprises platinum.

7. The method according to claim 1, wherein the upper and lower electrodes comprise a noble metal.

8. The method according to claim 7, wherein the adhesive layer precursor film is formed on a substrate.

9. The method according to claim 8, wherein the substrate comprises Si.

10. The method according to claim 9, wherein the dielectric thin film comprises barium titanate, strontium titanate or strontium barium titanate.

11. The method according to claim 10, wherein the temperature of the first and second heat treatments are at least about 50° C. higher than the crystallization temperature of the adhesive layer precursor film and dielectric layer precursor film, respectively.

12. The method according to claim 11, wherein the temperature of the third heat treatment is at least about 100° C. higher than the higher of the first and second heat treatments.

13. The method according to claim 1, wherein the temperature of the first and second heat treatments are at least about 50° C. higher than the crystallization temperature of the adhesive layer precursor film and dielectric layer precursor film, respectively.

14. The method according to claim 1, wherein the temperature of the third heat treatment is at least about 100° C. higher than the higher of the first and second heat treatments.

15. The method according to claim 1, wherein the adhesive layer precursor film and the dielectric thin film precursor film comprise the same elements in different ratios.

16. The method according to claim 1, wherein the first and second heating temperatures are the same.

17. The method according to claim 1, wherein the first and second heating temperatures are different.

18. A method for manufacturing a dielectric thin film capacitor comprising:
  forming a lower electrode on a substrate;
  coating a dielectric raw material solution on the lower electrode to form a precursor film;
  performing a first heat treatment at a temperature about 50° C. to 150° C. higher than the crystallization temperature of the precursor film to crystallize the precursor film and form a dielectric thin film;
  forming an upper electrode on the dielectric thin film; and
  performing a second heat treatment at a temperature at least about 100° C. higher than that of the first heat treatment.

19. The method according to claim 18, wherein the dielectric thin film comprises a metal compound having a perovskite structure.

20. The method according to claim 19, further comprising forming the lower electrode on a substrate before coating a dielectric raw material solution thereon.

21. The method according to claim 18, further comprising forming the lower electrode on a substrate before coating a dielectric raw material solution thereon.

* * * * *